(12) United States Patent
Liu

(10) Patent No.: US 6,221,204 B1
(45) Date of Patent: Apr. 24, 2001

(54) STACKABLE CHAMBER APPARATUS

(76) Inventor: Yu-tsai Liu, No. 45-2, 5 Lin, Shang Shan Tsun, Chiung Lin Village, Hsinchu County (TW)

( * ) Notice: Subject to any disclaimer, the term of this patent is extended or adjusted under 35 U.S.C. 154(b) by 0 days.

(21) Appl. No.: 09/493,029

(22) Filed: Jan. 27, 2000

(30) Foreign Application Priority Data

Sep. 14, 1999 (TW) .................................................. 88115948

(51) Int. Cl.$^7$ .................................................. H01L 21/00
(52) U.S. Cl. .................................................. 156/345; 134/84
(58) Field of Search ............................ 156/345; 118/302, 118/320; 427/240; 414/788, 935, 939, 941; 451/285–289; 134/116, 137, 84

(56) References Cited

U.S. PATENT DOCUMENTS

| | | | |
|---|---|---|---|
| 5,344,542 | * 9/1994 | Maher et al. | 204/298.15 |
| 5,571,325 | * 11/1996 | Ueyama et al. | 118/320 |
| 5,674,115 | * 10/1997 | Yamashita et al. | 451/289 |
| 5,820,449 | * 10/1998 | Clover | 451/287 |

* cited by examiner

Primary Examiner—Gregory Mills
Assistant Examiner—Alva C. Powell
(74) Attorney, Agent, or Firm—Baker & Daniels

(57) ABSTRACT

A stackable processing chamber apparatus includes a processing chamber unit and a driving device for driving said transmitting shaft to rotate. The processing chamber unit includes a body defining a chamber. The processing chamber unit is provided with an evacuating pipeline passing through the processing chamber unit and communicating with the chamber, a draining pipeline passing through the processing chamber unit and communicating with the chamber, a chuck rotatably mounted within the processing chamber unit, a transmitting mechanism for driving the chuck to rotate, and a transmitting shaft passing through the body and driving the transmitting mechanism.

2 Claims, 6 Drawing Sheets

STACKABLE CHAMBER APPARATUS

FIELD OF THE INVENTION

The present invention relates to a processing chamber apparatus, and in particular, to a processing chamber system having a plurality of processing chamber units which can be stacked with each other.

BACKGROUND OF THE INVENTION

In a manufacturing process of a semiconductor device or a liquid crystal display (LCD) including wet etching, cleaning, wet spin etching, coating, and developing, various kinds of acid tanks or chambers are utilized.

Conventionally, an acid tank used for wet etching, cleaning, coating, and developing is of an open type. An evacuating equipment is often used for evacuating the vaporized gas or acidic gas of the solvent utilized in the manufacturing process. However, the evacuating capacity cannot fulfill the need for protecting the workers. When the solvent or acidic gas has dispersed into the clean room, the health of the workers can be affected. Generally, the acid tank is used to process a batch of substrates, for example, the semiconductor wafers or the glass substrates of the LCDs. The parameters of the manufacturing process cannot be precisely controlled and wafer-to-wafer differences can be found. There are several kinds of processing chambers mostly for processing a single substrate, for example, a semiconductor wafer or an LCD glass substrate. The parameters of the manufacturing process can be precisely controlled and the wafer-to-wafer differences can be reduced. However, the production cost is adversely increased.

Referring to FIG. 1A, a processing chamber used for processing a substrate 105 includes a housing 101, a motor 102 mounted within the housing 101, a chuck 103 driven by the motor 102 for holding and rotating the substrate 105, and a nozzle 104 for dispensing the processing material 106 onto the substrate 105.

When the processing material 106 is dispensed onto the rotating substrate 105, the processing material 106 is uniformly distributed on the surface of the substrate 105 due to the centrifugal force.

The processing material 106 on the substrate 105 is continuously thrown out. The farther the distance from the center of the substrate 105 is, the greater the relative speed of the processing material 106 with respect to the air is.

In the case that the processing material 106 is a volatile material, the farther the distance from the center of the substrate 105 is, the more the vapor or gas of the processing material volatilizes in the open-type processing chamber. This causes ununiform concentration of the processing material 106 on the substrate 105, as shown in FIG. 1B. The horizontal axis denotes the distance away from the edge of the substrate 105, i.e., the position of the processing material 106 on the substrate 105, and the vertical axis denotes the concentration. The maximum concentration of the processing material occurs at the edge of the substrate 105, and the minimum concentration of the processing material occurs at the center thereof. Thus, the quality of the substrate is not uniform due to the within-wafer difference in a single wafer or LCD glass substrate.

Because the processing chamber apparatus illustrated in FIG. 1A is an open-type chamber for processing a substrate, the productivity is limited. Therefore, more processing chamber apparatuses have to be purchased so as to attain to the required productivity. Due to the restriction of the structure, the conventional processing chamber apparatuses cannot be stacked with one another. Therefore, they can be arranged on the ground of the clean room, and this increases the production cost.

In addition, under the condition that a plurality of processing chamber apparatuses are used for mass production, the qualities of the products are not uniform, and the repeatability thereof is poor because there are different parameters (the rotation speeds and the acceleration of the motors) between these processing chamber apparatuses.

In the processing chamber apparatus shown in FIG. 1A, the motor 102 directly drives the chuck 103, as shown in FIG. 2A. Thus, the heat generated by the motor 102 is directly transferred to the chuck 103. This causes the temperature variation of the substrate 105 mounted on the chuck 103. The temperature distribution on the substrate 105 is shown in FIG. 2B. Therefore, the temperature at the center of the substrate 105 is higher than that at the external edge, and this also causes a poor uniformity of the products.

SUMMARY OF THE INVENTION

It is therefore an object of the present invention to provide a stackable processing chamber apparatus in order to prevent toxic gas from dispersing to the clean room so that the qualities of the products are uniform. Furthermore, the space of the clean room is effectively utilized so as to lower the production cost.

In accordance with the first aspect of the invention, a stackable processing chamber apparatus includes a processing chamber unit and a driving device for driving said transmitting shaft to rotate. The processing chamber unit includes a body defining a chamber. The processing chamber unit is provided with an evacuating pipeline passing through the processing chamber unit and communicating with the chamber, a draining pipeline passing through the processing chamber unit and communicating with the chamber, a chuck rotatably mounted within the processing chamber unit, a transmitting mechanism for driving the chuck to rotate, and a transmitting shaft passing through the body and driving the transmitting mechanism.

In accordance with the second aspect of the invention, a stackable processing chamber apparatus includes a plurality of processing chamber units and a driving device. The plurality of processing chamber units are stacked in the chamber apparatus. The driving device drives the transmitting shaft to rotate.

Each of the plurality of processing chamber units includes a body defining at least one chamber and is provided with: at least one evacuating pipeline passing through the processing chamber unit and communicating with the at least one chamber; at least one draining pipeline passing through the processing chamber unit and communicating with the at least one chamber; a chuck rotatably mounted within the processing chamber unit; a transmitting mechanism for driving the chuck to rotate; and a transmitting shaft passing through the body and driving the transmitting mechanism.

The evacuating pipeline, the draining pipeline, and the transmitting shaft of one of the processing chamber units are connected to those of another one of the processing chamber units.

The number of the processing chamber units can be increased as desired. A plurality of chucks can be driven by the driving device. Thus, the qualities of the products obtained by processing substrates on different chucks will be substantially uniform. In addition, the heat energy generated by the driving device does not transfer to the substrates and affect the quality of the products.

DETAILED DESCRIPTION OF THE PREFERRED EMBODIMENTS

Figure 1A:
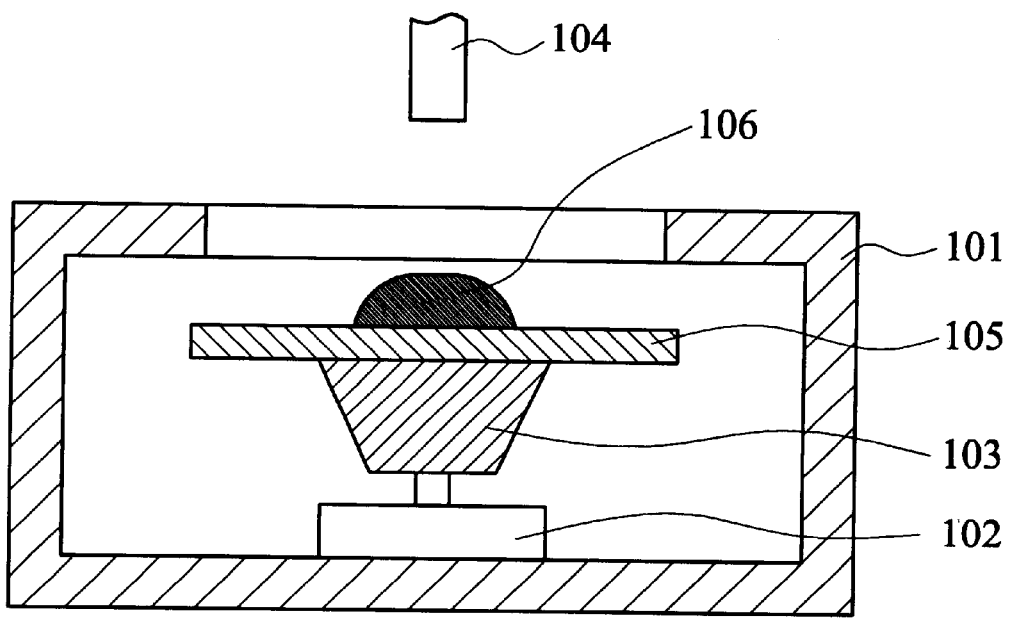
FIG. 1A is a schematic view showing a conventional open-type processing chamber apparatus.
Figure 1B:
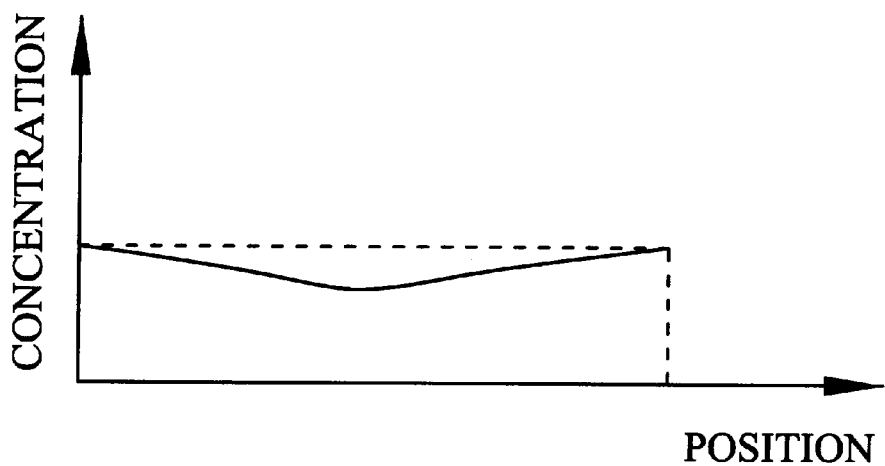
FIG. 1B shows the relationship between the position and the concentration of the processing material on a substrate as shown in FIG. 1A.
Figure 2A:
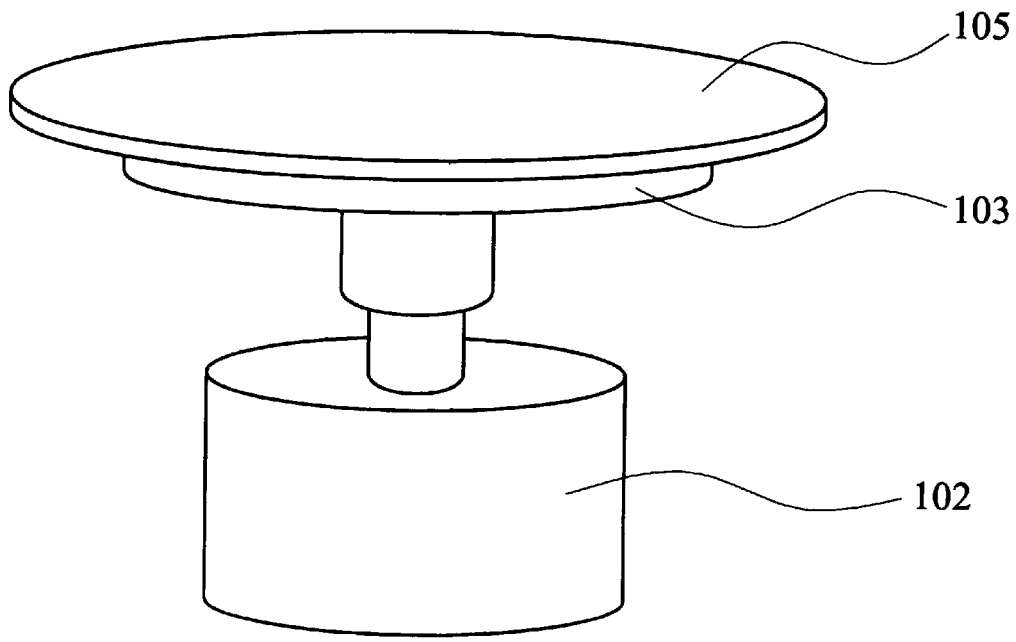
FIG. 2A is a pictorial view showing a motor, a chuck and a substrate as shown in FIG. 1A.
Figure 2B:
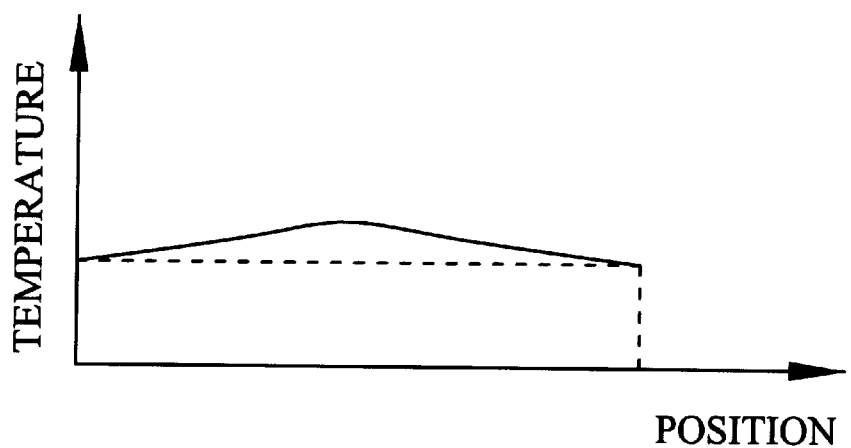
FIG. 2B shows the relationship between the position and concentration of the processing material on a substrate as shown in FIG. 2A.
Figure 3:
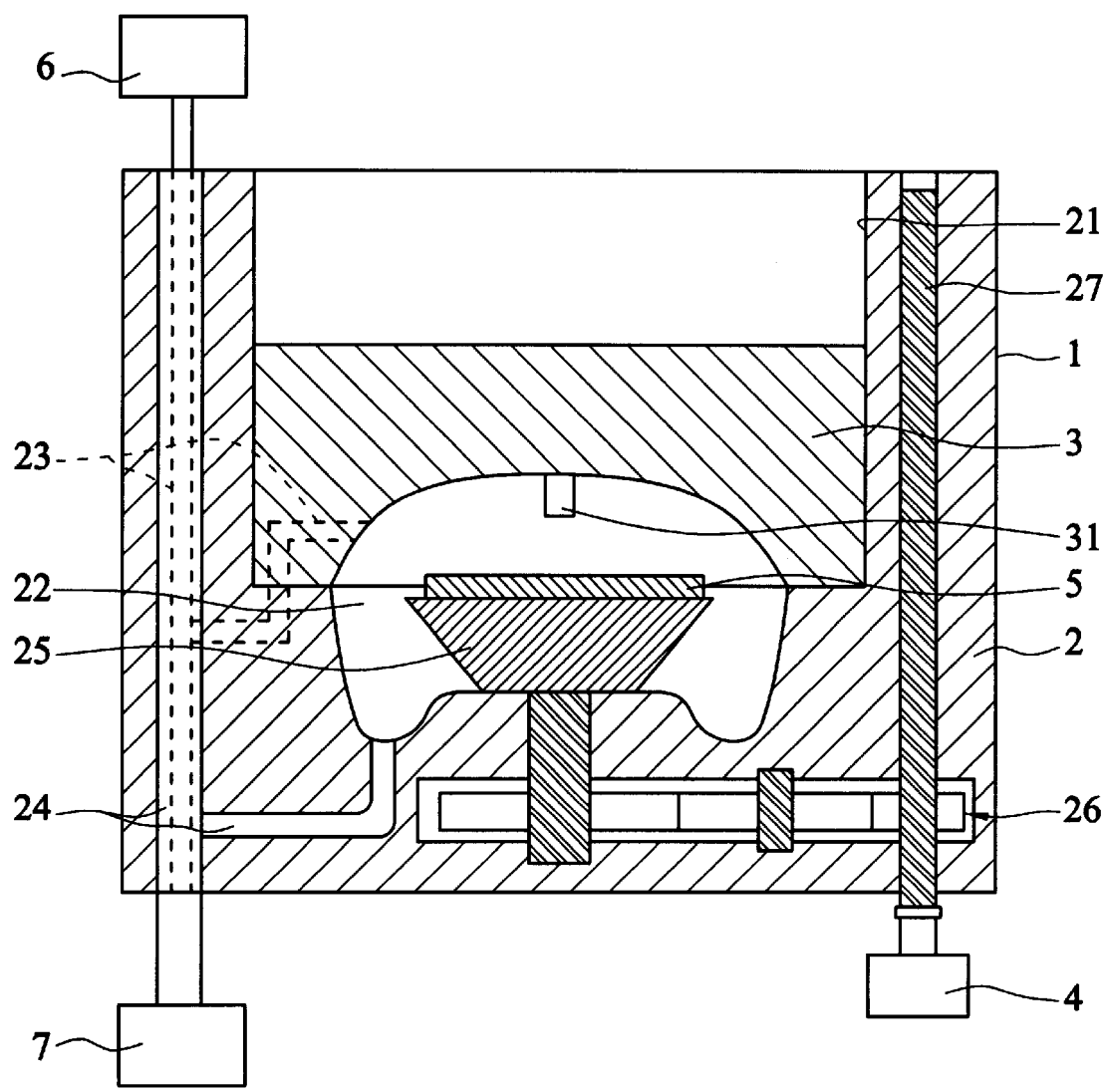
FIG. 3 is a schematic cross-sectional view showing a stackable processing chamber apparatus in accordance with the invention.

Referring to FIG. 3, the stackable processing chamber apparatus for processing a substrate 5 includes a processing chamber unit 1, a driving device (motor) 4, an evacuating device 6, and a receiving tank 7. The processing chamber unit 1 includes a body 2 having a guiding portion 21, and an upper cover 3 moveably mounted within the guiding portion 21 and covering the body 2.

A chamber 22 is formed in between the upper cover 3 and the body 2. The processing chamber unit 1 is provided with a set of evacuating pipelines 23 passing through the processing chamber unit 1 and communicating with the chamber 22; a set of draining pipelines 24 passing through the processing chamber unit 1 and communicating with the chamber 22; a chuck 25 rotatably mounted within the processing chamber unit 1; a transmitting mechanism 26 for driving the chuck 25 to rotate; and a transmitting shaft 27 passing through the body 2 for driving the transmitting mechanism 26.

A nozzle 31 is provided on the upper cover 3 for supplying the processing material onto the substrate 5. The driving device 4 is used to drive the transmitting shaft 27 and in turn, indirectly drive the substrate 5 to rotate.

The upper cover 3 moves up and down along the guiding portion 21. Thus, the steps for loading the substrate 5 onto the chuck 25 include:

1) lifting the upper cover 3 up;
2) loading the substrate 5 onto the chuck 25; and
3) lowering the upper cover 3 down.

The draining pipeline 24 and the evacuating pipeline 23 connect to the receiving tank 7 and the evacuating device 6 respectively. Thus, after the processing, the processing material is discharged to the receiving tank 7 via the draining pipeline 24. The gas or vapor generated is evacuated out from the chamber 22 via the evacuating pipeline 23 by the evacuating device 6.

Figure 4:
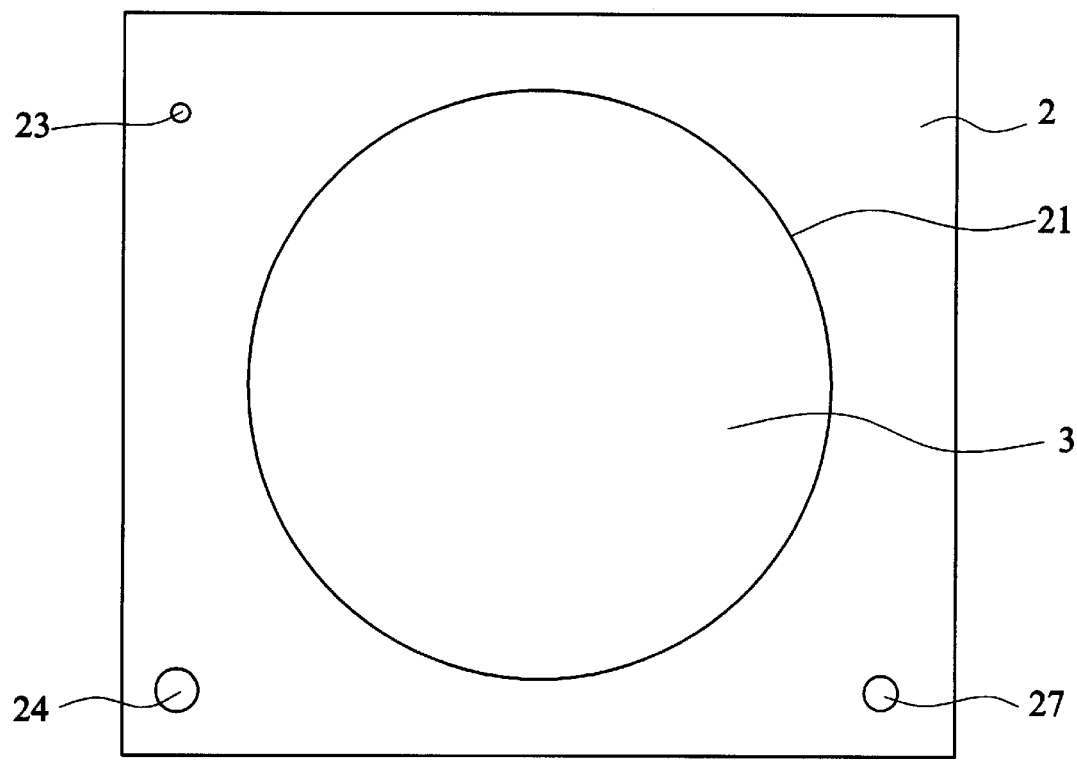
FIG. 4 is a top view showing the apparatus illustrated in FIG. 3 without the evacuating device.

The structure of the stackable chamber shown in FIG. 3 can be better understood with reference to FIG. 4.

Referring to FIG. 4, the body 2 is of a rectangular shape. A guiding portion 21 in the form of a cylinder is formed within the body 2. The upper cover 3 is also of a circular shape and can be accommodated within the guiding portion 21. The evacuating pipeline 23, the draining pipeline 24, and the transmitting shaft 27 are provided on the body 2 as shown in FIG. 4. Thus, the evacuating pipeline 23 and the draining pipeline 24 are stacked together as shown in FIG. 3.

The efficacy of the invention is shown by another preferred embodiment.

Figure 5:
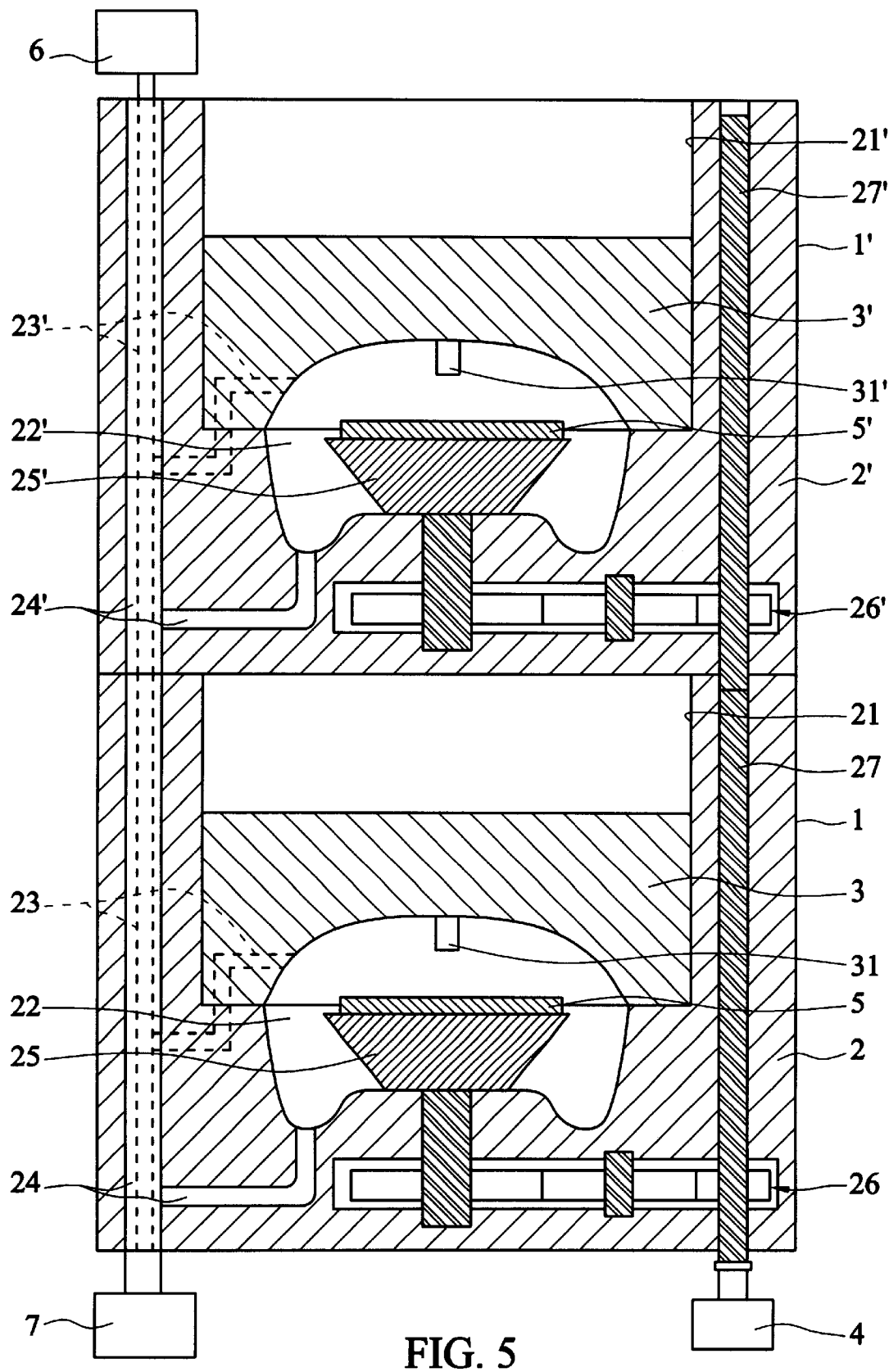
FIG. 5 is a schematic cross-sectional view showing a stackable processing chamber apparatus having two processing chamber units in accordance with another embodiment of the invention.

Referring to FIG. 5, the processing chamber apparatus includes two processing chamber units 1 and 1', an evacuating device 6, a receiving tank 7, and a driving device 4. The two processing chamber units 1 and 1' are substantially of the same structure. Therefore, for the processing chamber unit 1', the apostrophe "'" is used to denote the same element as that in processing chamber unit 1. Thus, a detailed description of these symbols is omitted in the following.

The processing chamber unit 1' is stacked onto the processing chamber unit 1 so that two substrates 5 and 5' can be processed simultaneously. The draining pipelines 24 and 24' are in communication with each other and are connected to the receiving tank 7. The evacuating pipeline 23 and the evacuating pipeline 23' are in communication with each other and connected to the evacuating device 6. The transmitting shafts 27 and 27' are in communication with each other so that they can rotate simultaneously.

Thus, the gas within the chambers 22 and 22' can be evacuated by the evacuating device 6. The processing material, after processing, is drained to the receiving tank 7 via the draining pipelines 24 and 24'. The power provided by the driving device 4 is transmitted to the transmitting shafts 27 and 27' simultaneously. Then, the chucks 25 and 25' are driven to rotate by the power via the transmitting mechanisms 26 and 26'.

Based on the above structure, in the case that the two substrates 5 and 5' are to be processed simultaneously, the upper covers 3 and 3' are raised up, and then the substrates 5 and 5' are loaded. Next, the upper covers 3 and 3' are lowered down, and, the driving device 4 is used for driving the chucks 25 and 25' to rotate. At the same time, the processing material is dispensed onto the substrates 5 and 5' via the nozzles 31 and 31' respectively as desired. At the same time of processing using the processing material, the gas or vapor within the chambers 22 and 22' can be evacuated by the evacuating device 6 and the used processing material is drained to the receiving tank 7 via the draining pipelines 24 and 24.

Figure 6:
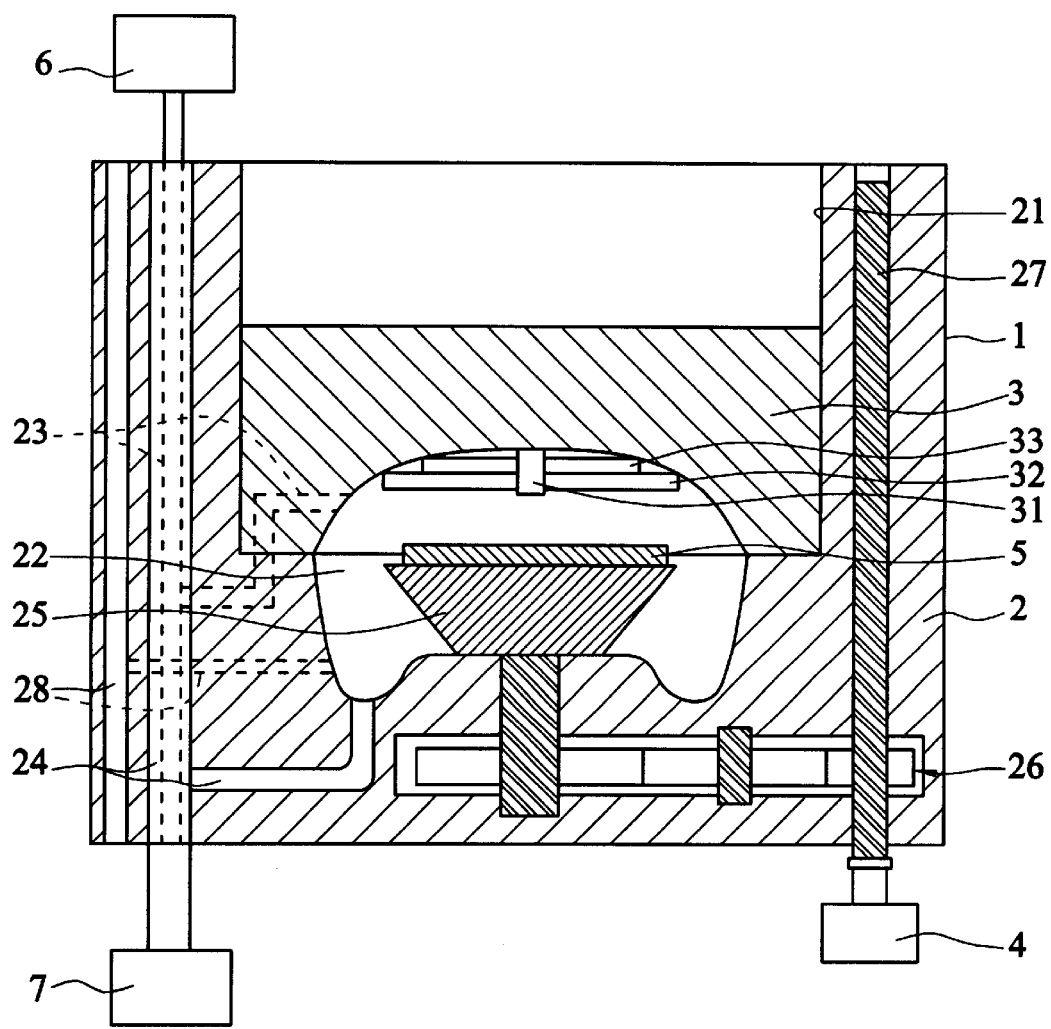
FIG. 6 is a schematic cross-sectional view showing a stackable processing chamber apparatus in accordance with yet another embodiment of the invention.

Similar elements shown in FIGS. 3 and 6 are labeled with same numbers and have similar functions.

Referring to FIG. 6, in order to increase the processing speed, a dispersion head 32, an ultrasonic oscillator 33, and a vacuum pipeline 28 are added to the processing chamber unit 1.

Generally, the dispersion head 32 can provide three functions: a) dispensing a predetermined gaseous processing material, for example, the vapor generated from the processing material dispensing from the nozzle 31, to the chamber 22; b) dispensing a special gas (nitrogen) onto the substrate 5 for drying the processing material on the substrate 5; and c) supplying a cleaning liquid for cleaning itself.

The ultrasonic oscillator 33 is used for oscillating the dispersion head 32. When a predetermined gaseous processing material is dispensed into the chamber 22 or a special gas is dispensed onto the substrate 5 by the dispersion head 32, by the oscillation provided by the ultrasonic oscillator 33, extra energy is provided to the dispensed material so that the substrate 5 can be processed faster and more effectively. When the cleaning liquid is dispensed to the dispersion head 32, the oscillation of the ultrasonic oscillator 33 can clean the dispersion head 32 quickly.

The vacuum pipeline 28 is used for rapidly evacuating the gas or vapor within the chamber 22.

A saturated vapor pressure of the processing material within the chamber 22 has to be reached in some processing procedures so that the processing material dispensing to the substrate 5 is not vaporized, thereby maintaining the quality of the product. Thus, the chamber 22 is evacuated to vacuum via the vacuum pipeline 28 before the processing material has dispensed from the nozzle 31. Then, the vapor or gas corresponding to the processing material dispensing from the nozzle 31 is dispensed from the dispersion head 32 so that the pressure within the chamber 22 rapidly reaches the saturated vapor pressure. Next, the processing material is dispensed from the nozzle 31 for processing the substrate 5.

Some special gas has to be used to dry the processing material on the substrate 5 in another processing procedure. At this instance, the special gas can be dispensed from the dispersion head 32. The processing material on the substrate 5 can be dried uniformly and rapidly according to the oscillation energy that is generated from the oscillator 33 and applied to the dispersion head 32.

In the case that a predetermined amount of processing material has been accumulated on the dispersion head 32, in order to prevent the processing material from falling from the dispersion head 32 in the next process and affecting the quality of the substrate 5, the dispersion head 32 is cleaned after a batch of substrates 5 has been processed. At this instance, the cleaning liquid is supplied to the dispersion head 32, with the oscillation energy from the ultrasonic oscillator 33 so as to rapidly clean away the processing material remained at the dispersion head 32.

The advantages of the embodiments in accordance with the invention are explained in the following.

In accordance with the embodiments of the present invention, both the rotation speed and the acceleration of the chuck 25 are the same as those of the chuck 25'. Therefore, the uniformity of the substrates is high, and the quality of the product is good.

In addition, the chucks 25 and 25' are not directly driven by the driving device 4. Therefore, the heat energy generated by the driving device 4 is not easily transmitted to the chucks 25 and 25'. Thus, the undesired effect incurred by the temperature differences between the substrates does not exist, and the quality of the product is stable.

The processing chambers stated above are of closed type. In the case that the processing material is a volatile material, the function of the evacuating device 6 can be disabled so that the saturated vapour pressure of the processing material within the closed chamber can be easily attained. Thus, ununiform concentration in the products does not occur. In addition, the closed chamber prevents the gas from escaping into the clean room, and therefore the gas cannot injure the workers.

A plurality of processing chamber units can be stacked together so that a lot of substrates can be processed simultaneously. Therefore, the qualities of the products are uniform and the space for receiving the processing chamber apparatus is reduced in the clean room.

Furthermore, the gas or vapor within the chamber 22 can be rapidly evacuated via the vacuum pipeline 28. The saturated vapor pressure of the processing material within the chamber 22 can be rapidly reached by the dispersion head 32. The gas or liquid dispensed from the dispersion head 32 possesses high energy so as to rapidly complete the processing procedures by employing the ultrasonic oscillator 33.

While the invention has been described by way of example and in terms of the preferred embodiments, it is to be understood that the invention is not limited to the disclosed embodiments. To the contrary, it is intended to cover various modifications. Therefore, the scope of the appended claims should be accorded the broadest interpretation so as to encompass all such modifications. For instance, the processing chamber units can be added if needed. Although there is an upper cover 3 provided on each processing chamber unit of each of the preferred embodiments, the functions, except the function of avoiding the gas leaking from the chamber 22, of the processing unit will not be affected if no upper cover 3 is provided. In addition, the shape of the upper cover 3 is not restricted to the round shape. Furthermore, the materials dispensed from the nozzle 31 or the dispersion head 32 are materials defined as the processing materials in the appended claims.

What is claimed is:

1. A stackable processing chamber apparatus, comprising:
   a plurality of processing chamber units stacked in vertical direction in said chamber apparatus, each of said plurality of processing chamber units including a body defining at least one chamber and being provided with:
   at least one evacuating pipeline passing through said processing chamber unit and communicating with said at least one chamber;
   at least one draining pipeline passing through said processing chamber unit and communicating with said at least one chamber;
   a chuck rotatably mounted within said processing chamber unit;
   a transmitting mechanism for driving said chuck to rotate; and
   a transmitting shaft passing through said body and driving said transmitting mechanism; and
   a driving device for driving each of said transmitting shaft to rotate, wherein:
      said evacuating pipeline, said draining pipeline and said transmitting shaft of each of said processing chamber units are connected to the evacuating pipeline, the draining pipeline and the transmitting shaft respectively of its adjacent chamber unit.

2. The stackable processing chamber apparatus according to claim 1, wherein:
   said body comprises a guiding means; and
   each of said processing chamber units further comprises an upper cover moveably mounted within said guiding means and covering said body, and said at least one chamber is formed in between said upper cover and said body.

* * * * *